(12) United States Patent
Hayashi

(10) Patent No.: US 6,581,028 B1
(45) Date of Patent: Jun. 17, 2003

(54) PROFILE EXTRACTION METHOD AND PROFILE EXTRACTION APPARATUS

(75) Inventor: Hirokazu Hayashi, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/245,860

(22) Filed: Feb. 8, 1999

(30) Foreign Application Priority Data

Oct. 7, 1998 (JP) ............................................. 10-285699

(51) Int. Cl.$^7$ .......................... G06F 17/50; G06F 17/10; G06G 7/62; H01L 21/8238

(52) U.S. Cl. ............................... 703/13; 703/2; 703/14; 438/142; 438/199; 438/289

(58) Field of Search ................................. 703/2, 13–14

(56) References Cited

U.S. PATENT DOCUMENTS

| | | | | |
|---|---|---|---|---|
| 5,319,564 A | * | 6/1994 | Smayling et al. | 703/13 |
| 5,761,481 A | * | 6/1998 | Kadoch et al. | 703/2 |
| 5,874,329 A | * | 2/1999 | Neary et al. | 438/203 |
| 5,989,963 A | * | 11/1999 | Luning et al. | 438/289 |

FOREIGN PATENT DOCUMENTS

| | | |
|---|---|---|
| JP | 8-64821 | 3/1996 |
| JP | 10-32332 | 2/1998 |

OTHER PUBLICATIONS

Perng et al.; "The improvement of short–channel effects due to oxidation–induced boron redistribution for counter–implantation p–MOSFET'"; IEEE Elect. Dev. Lett.; pp. 237–239; May 1993.*

Wolf; "Silicon Processing for the VLSI Era"—vol. 2; pp. 315–316; Lattice Press; 1990.*

Cheng et al.; "Modeling of small size mosfets with reverse short channel and narrow width effects for circuit simulation"; Solid–State Elect.; pp. 1227–1231; Sep. 1997.*

Hanafi et al.; "A model for anomalous short–channel behavior in submicron MOSFETs"; IEEE Elect. Dev. Lett.; pp. 575–577; Dec. 1993.*

Wolf; "Silicon Processing for the VLSI Era"—Vol. 3; pp. 1–28; Lattice Press; 1995.*

Wolf; "Silicon Processing for the VLSI Era"—vol. 3; pp. 205–274; Lattice Press; 1995.*

Jacobs et al.; "Channel profile engineering for MOSFETs with 100 nm channel lengths"; IEEE Trans. Elect. Dev.; pp. 870–875; May 1995.*

Jacobs et al.; "MOSFET reverse short channel effect due to silicon interstitial capture in gate oxide"; Elect. Dev. Meeting; pp. 307–310; Dec. 1993.* van Dort et al.; "A high resolution study of two–dimensional oxidationenhanced diffusion in silicon"; Elect. Dev. Meeting; pp. 299–302; Dec. 1993.*

(List continued on next page.)

Primary Examiner—Hugh M. Jones
(74) Attorney, Agent, or Firm—Volentine Francos, PLLC

(57) ABSTRACT

In a profile extraction method, a long channel profile is first extracted through an initial profile generating stage and a long channel profile extraction stage. In a following two-dimensional profile extraction stage, a two-dimensional channel profile extraction stage and a source/drain profile extraction stage are repeated to extract an optimized two-dimensional channel profile and an optimized source/drain profile. In the two-dimensional channel profile extraction stage, a two-dimensional channel profile is extracted from the gate length dependency of the threshold voltage. In addition, in the source/drain profile extraction stage, a source/drain profile is extracted from the substrate bias voltage dependency of the threshold voltage—gate length characteristics.

19 Claims, 20 Drawing Sheets channel profile expression $$C(x, y) = A \cdot \Delta C_{pile-up}(y) \cdot \exp(-x/\lambda 1) + B \cdot \Delta C_{BD}(y) \cdot \exp(-x/\lambda 2) + C_{bulk}(y)$$

A, B : fitting parameters
$\Delta C_{pile-up}$: pile–up component of impurity change quantity
$\Delta C_{BD}$: accelerated diffusion component of impurity change quantity,
$C_{bulk}$: long channel profile
$\lambda 1, \lambda 2$: attenuation lengths in channel direction
x: distance from gate end in direction of channel length
y: distance from channel interface in direction of channel depth with $C_{pile-up}(y) + \Delta C_{BD}(y) = 0$ being true

OTHER PUBLICATIONS

Adan et al.; "Analytical short–channel effect model for ultra–thin SOI MOSFETs including floating body effects"; SOI Conf.; pp. 106–107; Oct. 1997.*

Nandakumar et al.; "A .25 micron gate length CMOS technology for 1V low power applications–device design and power/performance considerations; "; VLSI Technology 1996; pp. 68–69; Jun. 1996.*

Wu et al.; "A new method for extracting the counter–implanted channel profile of enhancement–mode p–MOSFETs"; IEEE Trans. Elect. Dev.; pp. 2227–2233; Dec. 1997.*

Yu et al.; "Validation of two–dimensional implant and diffusion profiles using novel scanning capacitance microscope sample preparation and deconvolution techniques"; IEDM '98; pp. 717–720; Dec. 1998.*

Yu et al.; "Short–channel effect improved by lateral channel–engineering in deep–submicronmeter MOSFETs"; IEEE Trans. Elect. Dev.; pp. 627–634; Apr. 1997.*

Cao et al.; "Effects of channel and source/drain implants on partially–depleted SOI/MOSFETs"; SOI Conf.; pp. 98–99; Oct. 1996.*

Rafferty et al.; "Explanation of reverse short channel effect by defect gradients"; Elect. Dev. Meeting; pp. 311–314; Dec. 1993.*

Chaudhrya et al.; "Suppression of reverse short channel effect by high energy implantation", Elect. Dev. Meeting; pp. 679–682; Dec. 1997.*

Nishi et al.; "Evidence of channel profile modification due to implantation damage studied by a new method, and its implication to reverse short channel effects of nMOSFETs"; Elect. Dev. Meeting; pp. 993–995; Dec. 1995.*

Hane et al.; "Dopant diffusion model refinement and its impact on the calculation of reverse short channel effect"; Elect. Dev. Meeting; pp. 803–806; Dec. 1996.*

Machala et al.; "The role of boron segregation and transient enhanced diffusion on reverse short channel effect"; SISPAD '97' pp. 141–143; Sep. 1997.*

Mazure et al.; "Guidelines for reverse short–channel behavior", IEEE Elect. Dev. Lett.; pp. 556–558; Dec. 1989.*

Esseni et al.; "Nonscaling of MOSFETs linear resistance in the deep submicrometer regime"; IEEE Elect. Dev. Lett.; pp. 131–133; Apr. 1998.*

Gossmann et al.; "Suppression of reverse short channel effect by a buried carbon layer"; Elect. Dev. Meeting '98; pp. 725–728; Dec. 1998.*

Narayanan et al.; "On the reverse short–channel effects of submicron MOSFETs"; Southcon/96; pp. 345–349; Jun. 1996.*

Narayanan et al.; "A model for reverse short–channel effects in MOSFETs"; 1995 Proc. Dev., Ckt, and Syst.; pp. 294–297; Dec. 1995.*

Szelag et al.; "Comprehensive analysis of reverse short–channel effect in silicon MOSFETs from low–temperature operation"; IEEE Elect. Dev. Lett.; pp. 511–513; Dec. 1998.*

Brut et al.; "Physical model of threshold voltage in silicon MOS transistors including reverse short channel effect"; Elect. Lett.; pp. 411–412; Mar. 1995.*

Kunikiyo et al.; "Reverse short–channel effects induced due to the lateral diffusion of the point–defects induced by the source/drain ion implantation"; NUPAD IV; pp. 51–56; Jun. 1992.*

Kunikiyo et al.; "Reverse short–channel effect due to the lateral diffusion of point–defect induced by source/drain ion implantation"; IEEE Trans. CAD of ICs; pp. 507–514; Apr. 1994.*

Arora et al.; "Modeling the anomalous voltage behavior of submicrometer MOSFETs"; IEEE. Elect. Dev. Lett.; pp. 92–94; Feb. 1992.*

Subramanian et al.; "Reverse short channel effect and channel length dependence of Boron penetration in pMOSFETs"; Elect. Dev. Meeting; pp. 423–426; Dec. 1995.*

Chung et al.; "Direct observation of the lateral nonuniform channel doping profile in submicron MOSFETs from an anomalous charge pumping measurement results"; VLSI Tech. 1995; pp. 103–104; Jun. 1995.*

Liu et al.; "Threshold voltage model for deep–submicron MOSFETs"; IEEE Trans. Elect. Dev.; pp. 86–95; Jan. 1993.*

Williams et al.; "ADAM: a two dimensional, two carrier MOSFET simulator based on generalized stream functions"; IEEE Trans CAD of ICs; pp. 243–250; Feb. 1988.*

Leblebici et al.; "A one–dimensional MOSFET model for simulation of hot–carrier induced device and circuit degradation"; Ckts & Sys.; pp. 109–112; May 1990.*

Booth et al; "Simulation of a MOS transistor with spatially nonuniform channel parameters"; IEEE Trans. CAD of ICs; pp. 1354–1357; Dec. 1990.*

Guvench et al.; "Concurrent use of two–dimensional process and device simulators in the development of a latch–up free BiCMOS process"; Proc. Univ./Gov./Indust Microelect. Symp.; pp. 159–163; Jun. 1991.*

Law et al.; "Low–temperature annealing of arsenic/phosphorus junctions"; IEEE Trans. Elect. Dev.; pp. 278–284; Feb. 1991.*

Leblebici et al.; "Modeling of nMOS transistors for simulation of hot–carrier–induced device and circuit degradation"; IEEE Trans. CAD of ICs; pp. 235–246; Feb. 1992.*

Sherony et al.; "Reduction of threshold voltage sensitivity in SOI MOSFETs"; IEEE Elect. Dev. Lett.; pp. 100–102; Mar. 1995.*

Fiegna et al.; "Solution of 1–D Schrodinger and Poisson equations in single and double gate SOI MOS"; SISPAD '97' pp. 93–96; Sep. 1997.*

Wolf et al.; "Direct measurement of Leff and channel profile in MOSFETs using 2–D carrier profiling techniques"; IEDM '98; pp. 559–562; Dec. 1998.*

Dasgupta et al.; "A two–dimensional analytical model of threshold voltages of short–channel MOSFETs with Gaussian–doped channels"; IEEE Trans. Elect. Dev.; pp. 390–392; Mar. 1988.*

Kubota et al.; "A practical method for extracting impurity profiles and effective mobilities of MOSFETs with nonuniform cahnnel doping"; ICMTS '90; pp. 9–14; Mar. 1990.*

Mizuno et al.; "Experimental study of threshold voltage fluctuation due to statistical variation of channel dopant number in MOSFETs"; IEEE trans. Elect. Dev.; pp. 2216–2221; Nov. 1994.*

Sadana et al.; "Enhanced short channel effects in nMOSFETs due to Boron redistribution induced by arsenic source and drain implant"; Elect. Dev. Meeting; pp. 849–852; Dec. 1992.*

Dejenfelt; "An analytical model for the internal electric field in submicrometer MOSFETs": IEEE Trans. Elect. Dev.; pp. 1352–1363; May 1990.*

Taur et al.; "On effective channel length in .1 micron MOSFETs": IEEE Elect. Dev. Lett.; pp. 136–138; Apr. 1995.*

Yu et al.; "Reverse short–channel effects and channel engineering in deep–submicron MOSFETs: modeling and optimization"; VLSI Tech. '96; pp. 162–163; Jun. 1996.*

Nadim Khalil, "The Extraction of Two–Dimensional MOS Transistor Dopin via Inverse Modeling" IEEE Electron Device Letters, vol. 16, No. 1, Jan. 1995, pp. 17–19.

Zachary K. Lee et al., "Inverse Modeling of MOSFETs using I–V Characteristics in the Subthreshold Region" (4 pages).

* cited by examiner

FIG. 4 decision-making criterion $$\Sigma \, (Id^{(measured)} - Id^{(simulation)})^2 < ERR \text{ (sub-threshold area)},$$

with WI representing weight ERR representing
the allowable error between the measurement
and the simulation, and Id inclusive of the substrate bias,
drain bias dependency

FIG. 6 channel profile expression $$C(x, y) = A \cdot \Delta C_{pile-up}(y) \cdot \exp(-x/\lambda 1) + B \cdot \Delta C_{BD}(y) \cdot \exp(-x/\lambda 2) + C_{bulk}(y)$$

A, B : fitting parameters $\Delta C_{pile-up}$: pile-up component of impurity change quantity $\Delta C_{BD}$: accelerated diffusion component of impurity change quantity, $C_{bulk}$: long channel profile $\lambda 1, \lambda 2$: attenuation lengths in channel direction x: distance from gate end in direction of channel length y: distance from channel interface in direction of channel depth with $C_{pile-up}(y) + \Delta C_{BD}(y) = 0$ being true

FIG. 7 channel profile extraction method (1) long channel profile extraction
↓
(2) profile change quantity (offset from long channel profile) extraction
↓
(3) extension to lateral (lateral direction) distribution
↓
(4) superimposing with long channel profile

FIG. 12 surface profile extraction method
        (one dimensional point defect model)

$$\partial C_I / \partial t + \Sigma\, \partial C_{AI} / \partial t = -\nabla J_I - \Sigma\, \nabla J_{AI} - R_{LV} + R_{IV}$$

$$\partial C_V / \partial t + \Sigma\, \partial C_{AV} / \partial t = -\nabla J_V - \Sigma\, \nabla J_{AV} - R_{LV} + R_{IV}$$

$$\partial C_{Atotal} / \partial t = \nabla \{D_{AI}\, C_{Atotal}(C_I/C_I^*)\nabla \log(pC_{Atotal}\, C_I/C^* ni)\} \\ + \nabla \{D_{AV}\, C_{Atotal}(C_V/C_V^*)\nabla \log(pC_{Atotal}\, C_V C^* ni)\}$$

A=all dopant species , I=interstitial , V=vacancy

FIG. 13 surface profile extraction method
(various functional expressions)

— exponential function
— delta function
— Gaussian distribution function
— spline function FIG. 18
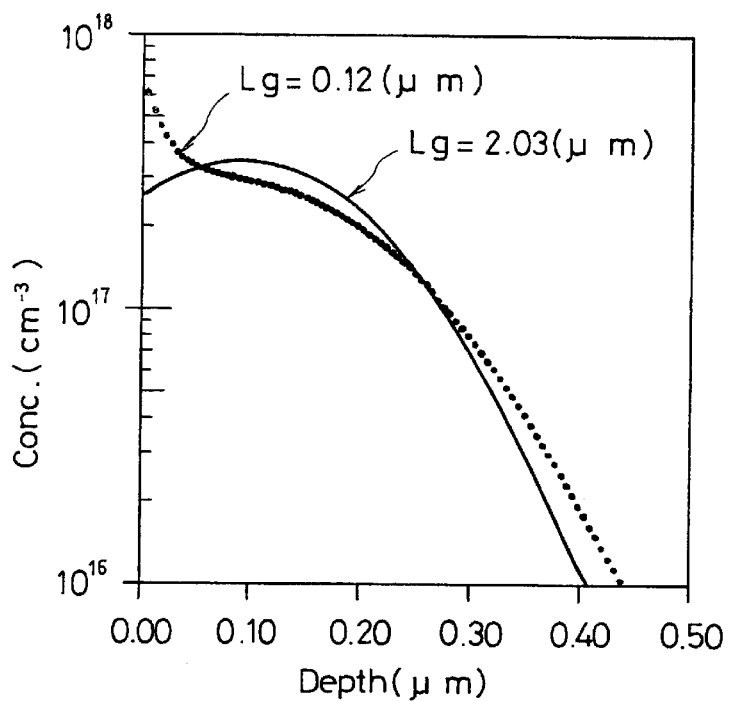
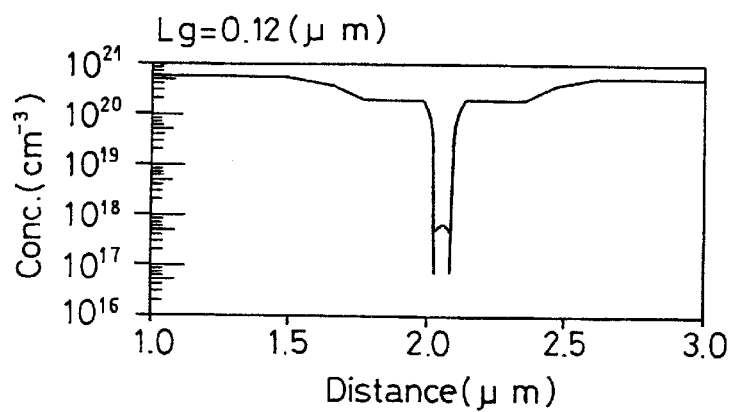
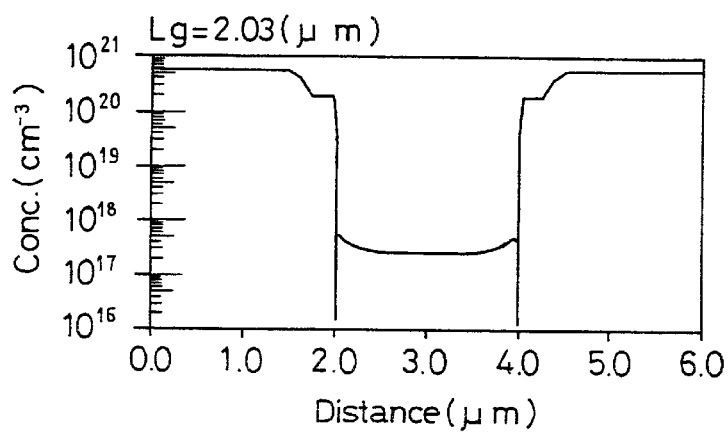

PROFILE EXTRACTION METHOD AND PROFILE EXTRACTION APPARATUS

BACKGROUND OF THE INVENTION

The present invention relates to a profile extraction method and a profile extraction apparatus.

In recent years, as further miniaturization of MOSFET devices has been achieved through advances in integration technology such as LSI, it has become difficult to directly detect the impurity concentration distribution (hereafter referred to as "profile") from a device at the actual product level (hereafter referred to as "actual device"). Since various characteristics are affected by the profile in a MOSFET, it is crucial that accurate profile extraction be achieved in order to realize a higher degree of efficiency in production. Such circumstances have rendered even more importance to the inverse modeling technology, i.e., the technology through which the profile is extracted through simulation implemented by utilizing the electrical characteristics measured from the device.

The profile extraction methods in the prior art that employ the inverse modeling technology include, for instance, the method disclosed in K. Khalil et al., IEEE EDL-16 (1), p.17, 1995. In the profile extraction method disclosed in this publication, the capacity-voltage characteristics (hereafter referred to as "C-V characteristics") of various TEG patterns and sample devices are utilized as the electrical characteristics. In this context, "TEG" stands for "test element group", which means a test piece group. In addition, a sample device refers to a device exclusively used for testing, which is prepared at a size that allows measurement through processes similar to those for manufacturing an actual device.

The method disclosed in Z. K. Lee et al., IEDM Tech. Dig. pp. 683, 1997 is another example of a profile extraction method adopting the inverse modeling technology. In the profile extraction method disclosed in this publication, the currentvoltage characteristics (hereafter referred to as "I-V characteristics") of one device only are utilized as the electrical characteristics, and the channel profile is extracted with the source/drain profile (hereafter referred to as "S/D profile") remaining fixed. In this context, the S/D profile refers to impurity concentration distribution in the source area/drain area, and the channel profile refers to the impurity concentration distribution in the substrate area formed under the gate electrodes.

However, the profile extraction methods in the prior art described above require a special TEG pattern or a large sample device to obtain measured values representing the electrical characteristics, and moreover, there is a possibility that the extracted profile which is the profile of a sample device or the like may be different from the profile of the actual device.

In addition, when a two-dimensional channel profile with the direction of the length of the channel assuming one dimension and the direction of the depth of the channel assuming the other dimension is extracted with the S/D profile fixed, the extracted two-dimensional channel profile may not be utilized for other MOSFETs having different S/D profiles. Furthermore, since the two-dimensional channel profile is determined based upon the electrical characteristics of one device in the prior art, there is a possibility that the extracted two-dimensional channel profile cannot assure the electrical characteristics of another device with different design requirements such as, for instance, a different gate length. It is to be noted that the gate length refers to the distance from the drain end to the source end.

Moreover, since the sensitivity of the two-dimensional channel profile with respect to the electrical characteristics decreases as the gate length is increased in a MOSFET, accurate profile extraction is difficult in the profile extraction methods in the prior art. Also, since it is necessary to perform individual calculations for each device in the profile extraction methods in the prior art, the length of time required for calculation increases as the number of devices for extraction increases.

SUMMARY OF THE INVENTION

An object of the present invention, which has been completed by addressing the problems of the profile extraction methods in the prior art discussed above, is to provide a new and improved profile extraction method and a new and improved profile extraction apparatus that make it possible to extract a profile from an actual semiconductor device.

Another object of the present invention is to provide a new and improved profile extraction method and a new and improved profile extraction apparatus through which, an S/D profile as well as a channel profile can be extracted.

Yet another object of the present invention is to provide a new and improved profile extraction method and a new and improved profile extraction apparatus that are capable of achieving extraction results which assure profiles of a plurality of semiconductor devices having different gate lengths.

Yet another object of the present invention is to provide a new and improved profile extraction method and a new and improved profile extraction apparatus in which calculation is simpler and is executed faster.

Normally, in a semiconductor device such as a MOSFET, the source area and the drain area, which have higher impurity concentrations than the substrate area under the gate electrodes, are highly conductive. Consequently, the effect of the S/D profile on the electrical characteristics is not taken into consideration when performing profile extraction in the prior art. However, channel profiles in the vicinity of the source end and in the vicinity of the drain end are subject to the effect of the S/D profile due to factors such as impurity ion implantation implemented during the formation of the source area and the drain area. When the channel profile is under the influence of the S/D profile in this manner, while the electrical characteristics in a semiconductor device having a large gate length are only affected to a small enough degree to be disregarded, the electrical characteristics in a semiconductor device having a small gate length are affected to a significant degree that cannot be disregarded.

The inventor of the present invention has learned that the reverse short channel effect, which is known only through experience, can be explained by incorporating the above observation. The reverse short channel effect in this context refers to a phenomenon in which the threshold voltage temporarily rises before the short channel effect becomes pronounced. It is to be noted that the short channel effect refers to a phenomenon in which the threshold voltage falls drastically as the gate length is reduced in a semiconductor device such as a MOSFET. It is known in the prior art that the short channel effect is caused by the depletion layer extending from the drain area and the depletion layer extending from the source area projecting out to the substrate area under the gate electrodes. However, the cause of the reverse short channel effect has not yet been clarified.

FIG. 5 presents the results of measurement of the characteristics of the threshold voltage Vth relative to the gate length Lg (hereafter referred to as the "Vth-Lg characteristics") in a MOSFET with the substrate bias voltage Vsub set at 0, −3 and −5. In FIG. 5, a parameter k that indicates the shape of the drain end is incorporated, with the dotted line representing the results of measurement performed when k=1.0 and the solid line representing the results of measurement performed when k=2.0. As FIG. 5 illustrates, the Vsub dependency of the Vth-Lg characteristics is sensitive to change in the shape of the S/D profile when the substrate bias voltage Vsub is not 0 (Vsub =−3, −5).

The above observation leads to the conclusion that the effect of the S/D profile must be fully considered in order to accurately extract the channel profile of a semiconductor device.

Accordingly, in order to achieve the objects described above, the profile extraction method for extracting a profile of a semiconductor device adopts a structure comprising a first stage in which a two-dimensional channel profile which demonstrates dependency on the gate length is extracted based upon specific electrical characteristics and a virtual channel profile, a second stage in which a source/drain profile is extracted based upon the dependency on a specific application voltage that the specific electrical characteristics demonstrate and the two-dimensional channel profile and a third stage in which the first stage and the second stage are repeated until the error of a calculated value relative to a measured value with respect to the dependency of the specific electrical characteristic on the specific application voltage is within an allowable error range.

Through the profile extraction method structured as described above, since the gate length dependency is included in the two-dimensional channel profile that is extracted, batch extraction of profiles of a plurality of devices having varying gate lengths becomes possible. In addition, in the two-dimensional channel profile extracted through this method, changes in the electrical characteristics occurring due to, for instance, the reverse short channel effect and varying gate lengths can be reproduced. In addition, since the S/D profile and the channel profile are both extracted through the method, a profile extraction that takes into consideration the influence of the S/D profile on the channel profile is achieved.

The dependency of the threshold voltage on the gate length may be utilized for the specific electrical characteristics. Through the profile extraction method structured as described above, an appropriate two-dimensional channel profile which demonstrates dependency on the gate length can be extracted by including the dependency on the gate length in the electrical characteristics used in the profile extraction. Furthermore, since, according to the observation made by the inventor of the present invention, the threshold voltage demonstrates a high degree of sensitivity to a channel profile (in particular the information in the direction of the depth of the channel profile), an improvement is achieved and the accuracy of the profile extraction by incorporating the threshold voltage in the electrical characteristics.

In addition, it is ideal to use the dependency of the threshold voltage on the gate length under a condition whereby the substrate bias voltage is 0 as the specific electrical characteristics. As FIG. 5, which has been referred to earlier, indicates, the characteristics of the threshold voltage relative to the gate length are not dependent upon the shape of the S/D profile under the condition whereby the substrate bias voltage is 0. Consequently, through the method in which the channel profile can be extracted in a state in which the S/D profile shape can be disregarded, an appropriate channel profile can be extracted. Furthermore, the substrate bias voltage can be utilized as the specific application voltage.

Moreover, according to the present invention, a structure that includes a pretreatment step for extracting the effective channel length in the first stage may be adopted. The channel profile extraction method structured as described above, in which the effective channel length that has a higher degree of sensitivity to the threshold voltage than the profile is extracted in advance, achieves even more accurate extraction of the target profile. It is to be noted that a great number of methods for extracting the effective channel length have been proposed in the prior art, and that any one of the various effective channel length extraction methods may be selected to be adopted in the channel profile extraction method according to the present invention.

In addition, a structure in which the virtual channel profile is a two-dimensional profile achieved by superimposing a profile constituted of an non-uniform component on a uniform profile that achieves a uniform distribution in the direction of the channel length may be adopted. The uniform profile, which is utilized in the channel profile extraction method structured as described above may be easily set by, for instance, uniformly distributing a one-dimensional channel profile, various extraction methods for which have been proposed in the prior art, in the direction of the channel length. As a result, the method according to the present invention, in which the two-dimensional profile extraction can be implemented while essentially modifying only the non-uniform component, achieves simplification in the arithmetic calculation processing to enable efficient profile extraction. It is to be noted that it is ideal to use a one-dimensional channel profile extracted from a long-channel device as the one-dimensional channel profile that is used for setting the uniform profile. As explained above, the influence of the S/D profile is small enough to be disregarded in a long channel device. In other words, there is essentially no difference between the electrical characteristics of a long channel device and the electrical characteristics of a device having a one-dimensional profile in the direction of the channel depth at the channel central area of the long channel device uniformly distributed in the direction of the channel length to achieve a uniform profile. Thus, it is possible to extract the one-dimensional channel profile at the channel central area of a long channel device with a high degree of accuracy from various electrical characteristics.

It is to be noted that the one-dimensional profile in the direction of the channel depth of a profile constituted of a non-uniform component may be set, for instance, based upon the results of a comparison of specific electrical characteristics of a device into which additional ions are implanted and a device into which no additional ions are implanted, or in correspondence to a specific manufacturing process. Alternatively, the one-dimensional profile may be expressed using one or more functions arbitrarily selected from a group of functions comprising exponential functions, delta functions, Gaussian functions and spline functions.

In all of the channel profile extraction methods according to the present invention that have been explained so far, the two-dimensional channel profile can be expressed using a model formula; C (x, y)=delta C pile-up (x, y)+delta CBD (x, y)+C bulk (y). In the formula, delta C pile-up represents the pile-up (accumulated) component in the impurity change quantity and delta CBD represents the accelerated diffusion component in the impurity change quantity. In addition, C bulk (y) represents the long channel profile.

In addition, the model formula above may be changed to C (x, y)=A*delta C pile-up (y)*exp (−x/lambda 1)+B*delta CBD (y)*exp (−x/lambda 2)+C bulk (y). It is to be noted that A and B are fitting parameters that may be determined independently of each other. In addition, x represents the coordinate in the direction of the channel length whereas y represents the coordinate in the direction of the channel depth. Furthermore, lambda 1 and lambda 2 represent the attenuation factors in the direction of the channel length of the pile-up component and the accelerated diffusion component respectively of the impurity change quantity. A channel profile extraction method adopting this modified model formula is capable of handling the reverse short channel effect with the assumption that the impurity concentration is reduced exponentially as the distance from the gate end/source end increases. Moreover, by dividing the exponential function term into a plurality of terms, various factors having different attenuation factors can be included in the two-dimensional channel profile.

Furthermore, delta C pile-up (y) and delta CBD (y) in the modified model formula above may be substituted with, for instance, A'*exp (−y/lambda 3) and B'*C bulk$^{(short)}$ (y)*C bulk (y) respectively. In this case, A' and B' represent fitting parameters that may be determined independently of each other. In addition, lambda 3 indicates the attenuation factor of the pile-up component of the impurity change quantity in the direction of the channel depth, and C bulk$^{(short)}$ (y) represents the one-dimensional channel profile at the channel central area of the short channel device. By making these substitutions in the modified model formula above, the pile-up component and the accelerated diffusion component of the impurity change quantity can be expressed two-dimensionally.

In the channel profile extraction method according to the present invention, the S/D profile in the direction of the channel depth may be expressed through the profile extracted through the secondary ion mass spectroscopy (hereafter referred to as the "SIMS") method. In the channel profile extraction method so structured, an unknown parameter need only be set for the profile in the direction of the channel length by utilizing the profile measured through the SIMS method as the profile in the direction of the channel depth. Consequently, with the number of parameters that need to be optimized reduced, higher speed in the calculation is achieved and, at the same time, divergence of the calculation results is prevented.

It is to be noted that a structure in which the S/D profile is expressed by extending, in the direction of the channel length, the profile in the direction of the channel depth through one or more types of processing arbitrarily selected from a processing group comprising elliptic rotating processing and processing with a complementary error function may be adopted. In addition, a structure in which the S/D profile is expressed by implementing the one or more types of processing described above and then by implementing processing using a spline function may be adopted.

Furthermore, a profile extraction apparatus that is capable of executing the profile extraction method to solve the problems of the prior art described earlier may comprise a one-dimensional channel profile extraction unit which executes specific arithmetic calculation to output a one-dimensional channel profile when first electrical characteristics are input and a two-dimensional profile extraction unit which executes specific arithmetic calculation to output a two-dimensional profile when the one-dimensional channel profile and second electrical characteristics are input. In this structure, it is ideal to include the S/D profile in addition to a two-dimensional channel profile in the two-dimensional profile.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

FIG. 4 illustrates another initial profile extraction method that may be adopted in the profile extraction method in FIG. 1;

FIG. 6 presents a model formula of a two-dimensional channel profile that may be adopted in the profile extraction method in FIG. 1;

FIG. 7 illustrates a two-dimensional channel profile extraction method that may be adopted in the profile extraction method in FIG. 1;

FIG. 12 illustrates another method for setting the one-dimensional profile of the offset component that may be adopted in the profile extraction method in FIG. 1;

FIG. 13 illustrates yet another method for setting the one-dimensional profile of the offset component that may be adopted in the profile extraction method in FIG. 1;

FIG. 18 presents another set of test results regarding the two-dimensional profile pertaining to the profile extraction method in FIG. 15;

DETAILED DESCRIPTION OF THE PREFERRED EMBODIMENTS

The following is an explanation of the preferred embodiments of the present invention given in reference to the attached drawings. It is to be noted that the same reference numbers are assigned to components having identical functions and structural features in the following explanation and the attached drawings to preclude the necessity for repeated explanation thereof.

First Embodiment

First, in reference to FIGS. 1 to 14, the first embodiment is explained. In the following description of the first embodiment, the individual drawings that are to be referred to are explained as necessary.

Figure 1:
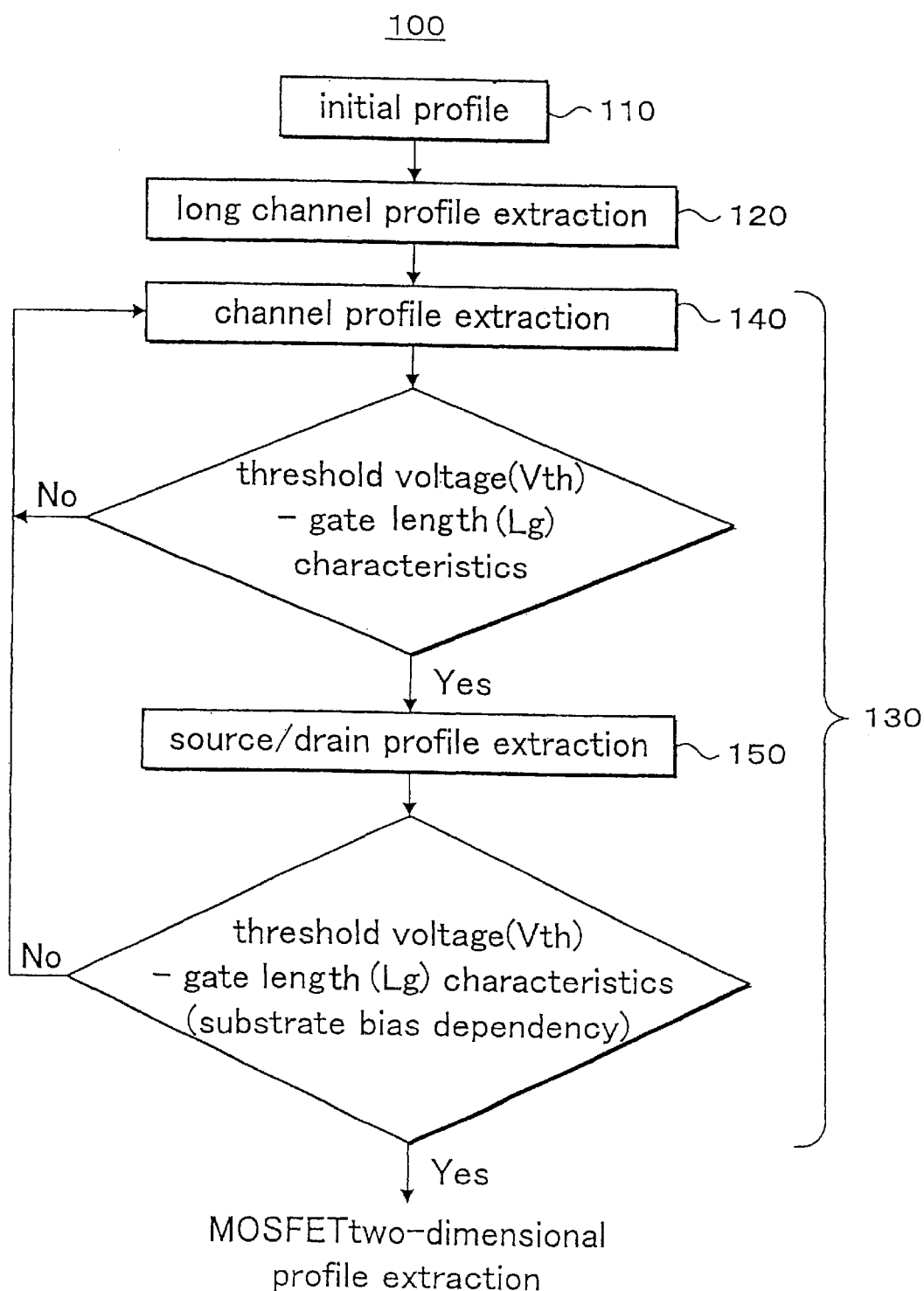
FIG. 1 is a flowchart presented for purposes of explaining a profile extraction method that may adopt the present invention.

FIG. 1 presents a flowchart that explains the profile extraction method 100 in the embodiment. As shown in FIG. 1, the profile extraction method 100 in the embodiment is primarily divided into three stages, which are implemented sequentially, i.e., an initial profile generating stage 110, a long channel profile extraction stage 120 and a two-dimensional profile extraction stage 130. Of these, the two-dimensional profile extraction stage 130, is further divided into a two-dimensional channel profile extraction stage 140 and an S/D profile extraction stage 150.

(Initial Profile Generating Stage 110)

During the initial profile generating stage 110, an initial profile is generated. In the profile extraction method 100, the initial profile is utilized as a start value when obtaining a channel profile of a long channel device which is to be detailed later. In this embodiment, no particular conditions or restrictions are imposed upon the initial profile, and various types of profiles may be utilized.

(a) A one-dimensional channel profile at the channel central area extracted through process simulation, the SIMS method or the like, for instance, may be used as the initial profile. Process simulation in this context refers to simulation through which the profile, the oxide film shape and the like of the product that is ultimately manufactured are extracted by analyzing a series of LSI manufacturing steps such as ion implantation, oxidation, diffusion, etching and the like. In addition, the SIMS method refers to a method through which mass spectrometry is performed on the secondary ions that are caused to eject through sputtering by irradiating primary ions on the surface of a sample device.

Figure 3:
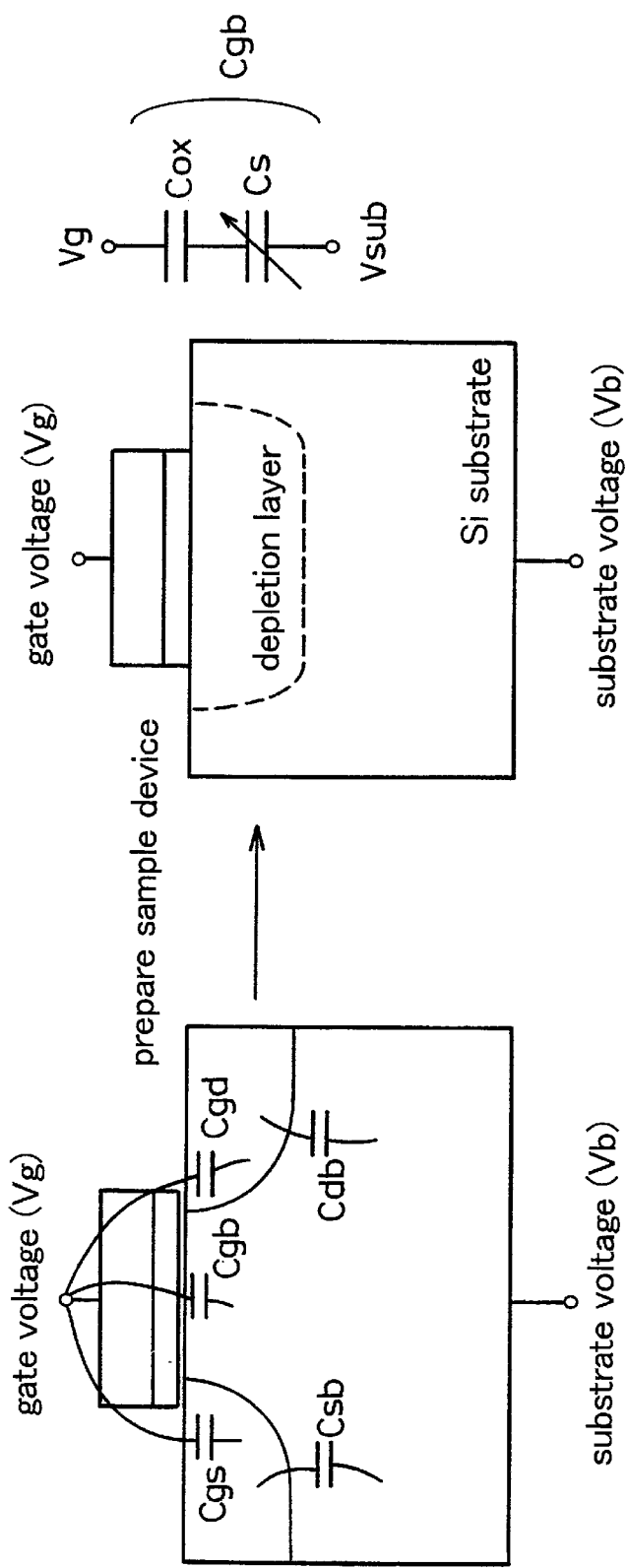
FIG. 3 illustrates an initial profile extraction method that may be adopted in the profile extraction method in FIG. 1.

(b) Alternatively, a channel profile that is extracted through simulation utilizing the C-V characteristics, for instance, may be used as the initial profile. The simulation that utilizes the C-V characteristics in this case may be, for instance, the simulation illustrated in FIG. 3. As shown in FIG. 3, through this simulation, the profile that has been set is modified by comparing the simulation value of the electrical capacity Ci and the measured value obtained through actual measurement of a TEG pattern or a sample device in regard to the value representing each substrate voltage Vb.

(c) As yet another alternative, the channel profile extracted through simulation utilizing the I-V characteristics may be used as the initial profile. The simulation utilizing the I-V characteristics in this case may be the simulation illustrated in FIG. 4. As shown in FIG. 4, through this simulation, a profile that has been set is modified by comparing the simulation value of the drain bias current Id and the measured value of the drain bias current Id while taking into consideration of the dependency on the substrate bias voltage Vsub.

(Long Channel Profile Extraction Stage 120)

During the long channel profile extraction stage 120, the one-dimensional channel profile in the direction of the channel depth in the vicinity of the channel central area of a long channel device (hereafter referred to as a "long channel profile") is extracted. In the channel area of a long channel device, only small areas in the vicinity of the source end and the drain end are subject to the influence of the S/D profile. Therefore, the extent to which the S/D profile influences the various electrical characteristics can be small enough to be disregarded and thus, the long channel profile can be obtained with a high degree of accuracy based upon the various electrical characteristics, in a long channel device having sufficient gate length.

In the profile extraction method 100 in this embodiment, the long channel profile is extracted in the long channel profile extraction stage 120 through, for instance, a simulation utilizing the dependency of the threshold voltage Vth on the substrate bias voltage Vsub (hereafter referred to as "Vth-Vsub dependency"). In more specific terms, the method disclosed in Japanese Unexamined Patent Publication No. 1998-32332 which pertains to one-dimensional profile extraction may be adopted. When the method disclosed in this publication is adopted in the long channel profile extraction stage 120, the long channel profile can be extracted by modifying the initial profile obtained in the initial profile generating stage 110 through, for instance, the procedure explained below. Namely, first the initial profile is rendered into a function, and then the calculated value representing the Vth-Vsub dependency is determined using the function of the initial profile. Next, the calculated value of the Vth-Vsub dependency is compared with the measured value of the Vth-Vsub dependency measured at the long channel device, and the functional expression of the initial profile is modified based upon the results of the comparison. Then, using the modified function, the calculated value of the Vth-Vsub dependency is obtained, this calculated value is again compared with the measured value of the Vth-Vsub dependency measured at the long channel device and modification is made on the function. Such modification is repeated until the calculated value of the Vth-Vsub dependency falls within a specific error range relative to the measured value of the Vth-Vsub dependency. As a result, the long channel profile can be extracted as a profile that is expressed through the function reached at the end of the modification process.

(Two-dimensional Profile Extraction Stage 130)

In the profile extraction method 100 in the embodiment, the two-dimensional channel profile and the S/D profile are extracted based upon the dependency of the threshold voltage Vth on the gate length Lg (hereafter referred to as the "Vth-Lg dependency") and the dependency of the Vth-Lg characteristics on the substrate bias voltage Vsub during the two-dimensional profile extraction stage 130.

The method explained below, for instance, may be adopted in the two-dimensional profile extraction stage 130. Namely, the two-dimensional channel profile may be expressed using the model formula presented in FIG. 6 to determine the parameters A, B, lambda 1 and lambda 2 so that the calculated value of specific electrical characteristics match specific electrical characteristics measured at the actual device. It is to be noted that in this method, the calculation is performed under a condition that the total dose quantity in the direction of the channel depth is constant.

When this method is adopted, the two-dimensional channel profile extraction stage 140 in the embodiment may be implemented through, for instance, the following procedure. Namely, first, the Vth-Lg dependency in the channel area that is not subject to the influence of the S/D profile is used as the specific electrical characteristics to extract the fitting parameter A and the attenuation length lambda 1 of the pile-up component. Next, by using the substrate bias voltage (Vsub) dependency of the Vth-Lg characteristics as the specific electrical characteristics, the fitting parameter B and the attenuation length lambda 2 of the accelerated diffusion component are extracted. It is to be noted that when determining these parameters, the total of the dose quantity in the direction of the channel depth should be assured by conforming to the conditional expression delta C pile-up (y)+ delta CBD (y)=0.

The two-dimensional channel profile expressed using the model formula presented in FIG. 6 as described above, achieves an impurity concentration distribution whereby it is high in the vicinity of the gate end and becomes exponentially reduced toward the channel central area. While the reverse short channel effect whereby the substrate bias voltage Vth temporarily rises as the gate length Lg becomes reduced is a phenomenon that is known through experience, this reverse short channel effect can be dealt with by expressing the two-dimensional channel profile using the model formula presented in FIG. 6. In addition, in the model formula in FIG. 6 in which the exponential function portion on the right side is divided into a first term and a second term, two components that are different from each other can be expressed in correspondence to the extension of the two-dimensional channel profile in the direction of the channel length. It goes without saying that the model formula in FIG. 6 makes it possible to express even more components in one formula by increasing the number of terms on the right side.

More specifically, during the two-dimensional profile extraction stage 130, the two-dimensional channel profile extraction stage 140 and the S/D profile stage 150, which are to be detailed later, are repeated to extract an optimized two-dimensional channel profile and an optimized S/D profile.

(Two-dimensional Channel Profile Extraction Stage 140)

The two-dimensional channel profile extraction stage 140 constituting a first stage is a process for extracting a two-dimensional channel profile. During this two-dimensional channel profile extraction stage 140, a two-dimensional channel profile is extracted by superimposing an offset component which corresponds to the profile of the non-uniform component on the two-dimensional profile corresponding to a flat uniform profile achieved by uniformly distributing the long channel profile in the direction of the channel length.

Figure 8:
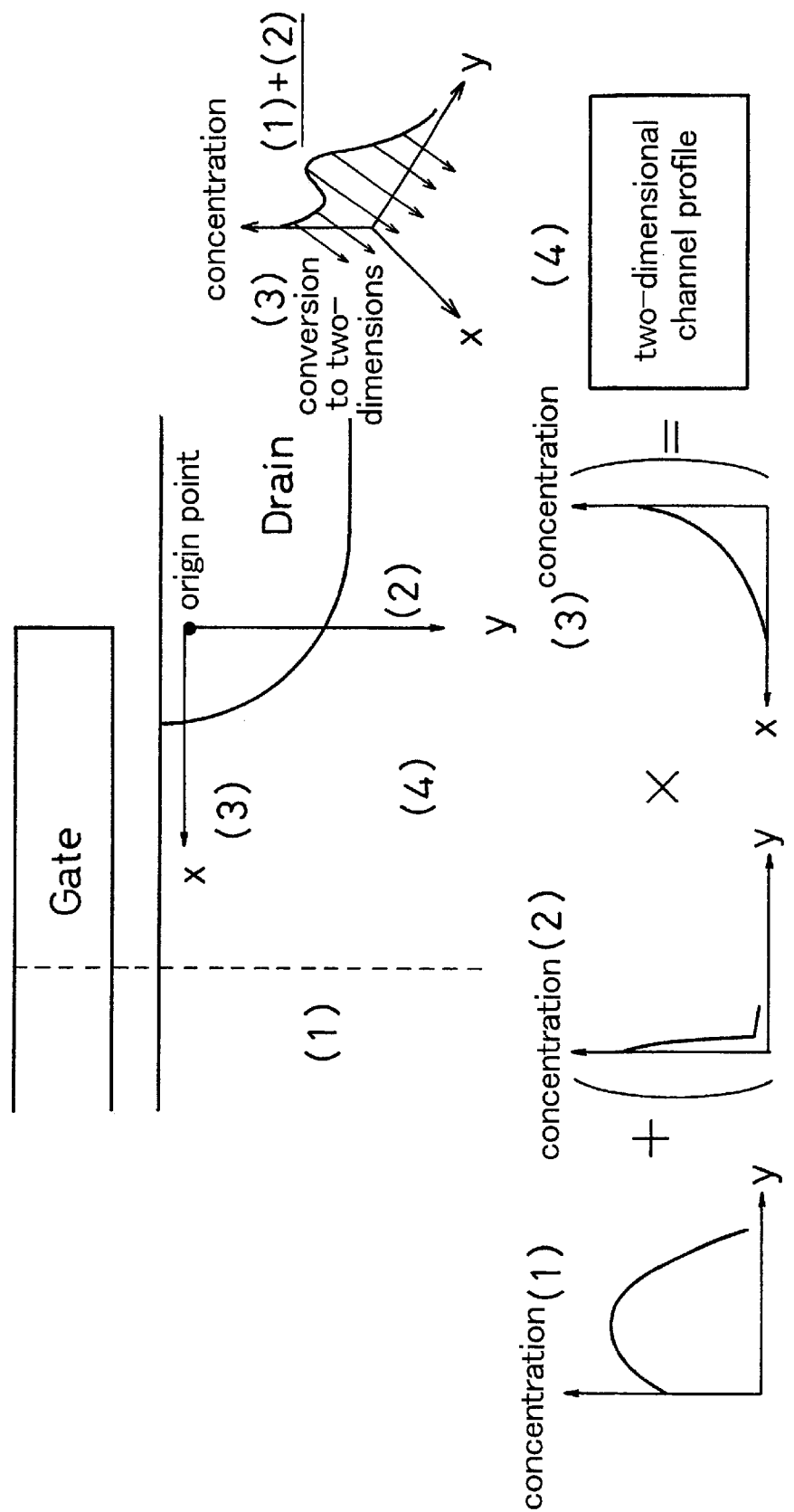
FIG. 8 illustrates another two-dimensional channel profile extraction method that may be adopted in the profile extraction method in FIG. 1.

Namely, as illustrated in FIGS. 7 and 8, a virtual profile of the offset component (profile change quantity) is set (see FIG. 7(2) and FIG. 8(2)) against the long channel profile extracted during the long channel profile extraction stage 120 explained earlier (see FIG. 7(1) and FIG. 8(1)) in the two-dimensional channel profile extraction stage 140. Next, a virtual two-dimensional channel profile is extracted by extracting and distributing the virtual profile of the offset component in the lateral direction (see FIG. 7(3) and FIG. 8(3)) and by superimposing it upon the uniform profile of the long channel profile (see FIG. 7(4) and FIG. 8(4)). When the virtual two-dimensional channel profile is extracted, modification is made on the profile of the offset component so that the virtual two-dimensional channel profile gives accurate Vth-Lg dependency under the condition that the substrate bias voltage Vsub=0, to adjust the two-dimensional channel profile.

In the two-dimensional channel profile extraction stage 140 explained above, the two-dimensional channel profile is extracted based upon the Vth-Lg dependency manifesting when the substrate as voltage Vsub=0. According to the findings of the inventor of the present invention, the Vth-Lg dependency achieves electrical sensitivity only to the offset component when the substrate bias voltage Vsub=0. Consequently, during the two-dimensional channel profile extraction stage 140, only the profile of the offset component needs to be modified without having to change the electrical characteristics of the long channel device which have already been optimized in the long channel profile extraction stage 120. As a result, the calculation process is simplified compared to that required in the profile methods in the prior art to achieve a reduction in the length of time required for calculation.

It is to be noted that the profile of the offset component may be set in an ideal manner by adopting, for instance, the method explained next. Namely, the offset component may be set by, first, setting the offset component generated in the channel profile as the one-dimensional profile for an area which is considered to be most influenced by the S/D profile and then rendering the one-dimensional profile thus set into a two-dimensional profile using a function that is expressed with parameters in the direction of the channel length.

By adopting this method for setting the offset component, the two-dimensional channel profile can be extracted while flexibly dealing with a channel structure in which the profile changes drastically at an arbitrary location due to, for instance, a pocket implantation. During this process, the one-dimensional profile of the offset component may be set through, for instance, one of the three methods explained below.

Figure 9:
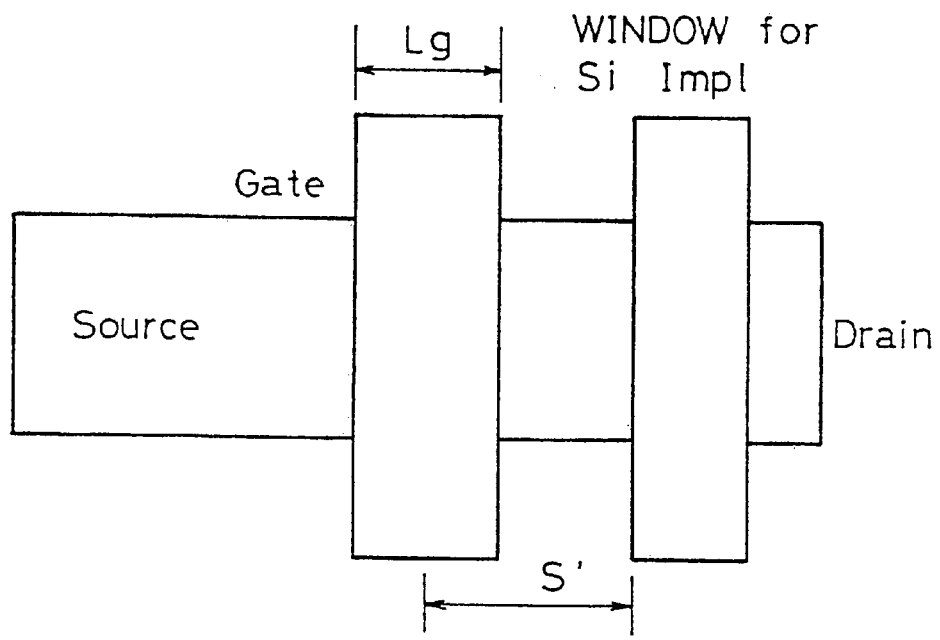
FIG. 9 illustrates a method for setting the one-dimensional profile corresponding to an offset component that may be adopted in the profile extraction method in FIG. 1.
Figure 10:
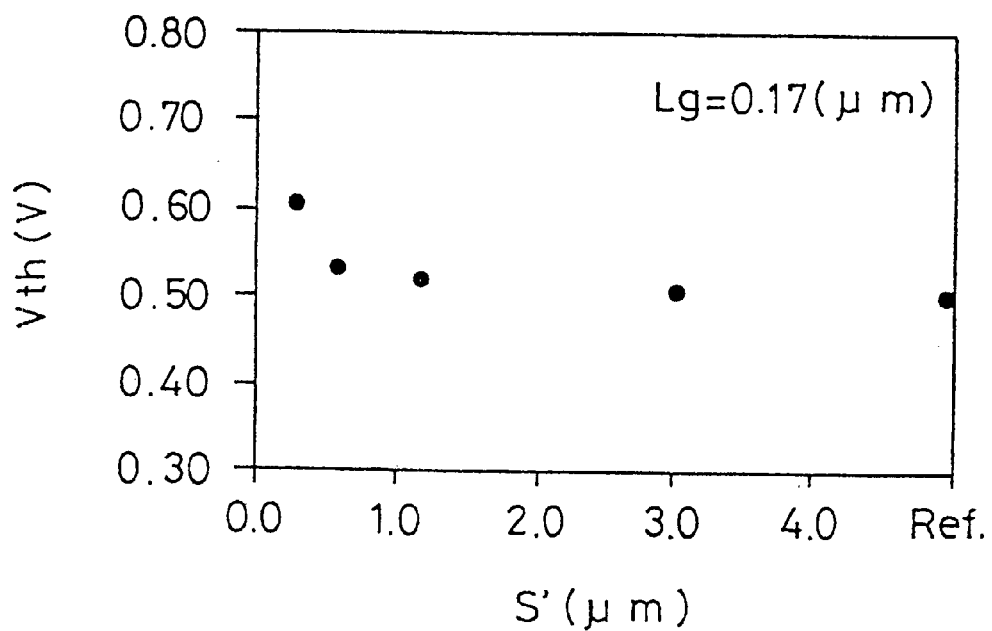
FIG. 10 presents data pertaining to the threshold voltage in the setting method illustrated in FIG. 9.

(a) In the first method, the one-dimensional profile of the offset component is extracted by adopting an additional implantation test method. In the additional implantation test method, a window for additional ion implantation is opened in the drain area in a TEG pattern to implant ions of Si or the like through the window. FIG. 9 illustrates a special TEG pattern that is employed in implantation testing. The details of the TEG pattern illustrated in FIG. 9 are disclosed in "Nishi et al., The Forty Third Applied Physics Convention, Spring Session, No. 0.26a-H-5, 1996". In addition, FIG. 10 illustrates the relationship between the distance S' from the channel center to the end of the window and the threshold voltage Vth in the TEG pattern in FIG. 9.

In the method according to the present invention, adopting the additional implantation testing process, first, two MOSFETs having the same channel length are prepared, and additional ion implantation is implemented on one of the MOSFETs through the additional ion implantation testing procedure. Next, the Vth-Vsub dependencies of both devices are measured. Then, the one-dimensional profile in the depthwise direction is extracted based upon the Vth-Vsub dependency of each of the two MOSFETs. In the following step, the quantity of change that has occurred in the channel profile due to the implantation damage is extracted based upon the difference between the two one-dimensional profiles that have been extracted, and this change quantity is set as the one-dimensional profile of the offset component.

Figure 11:
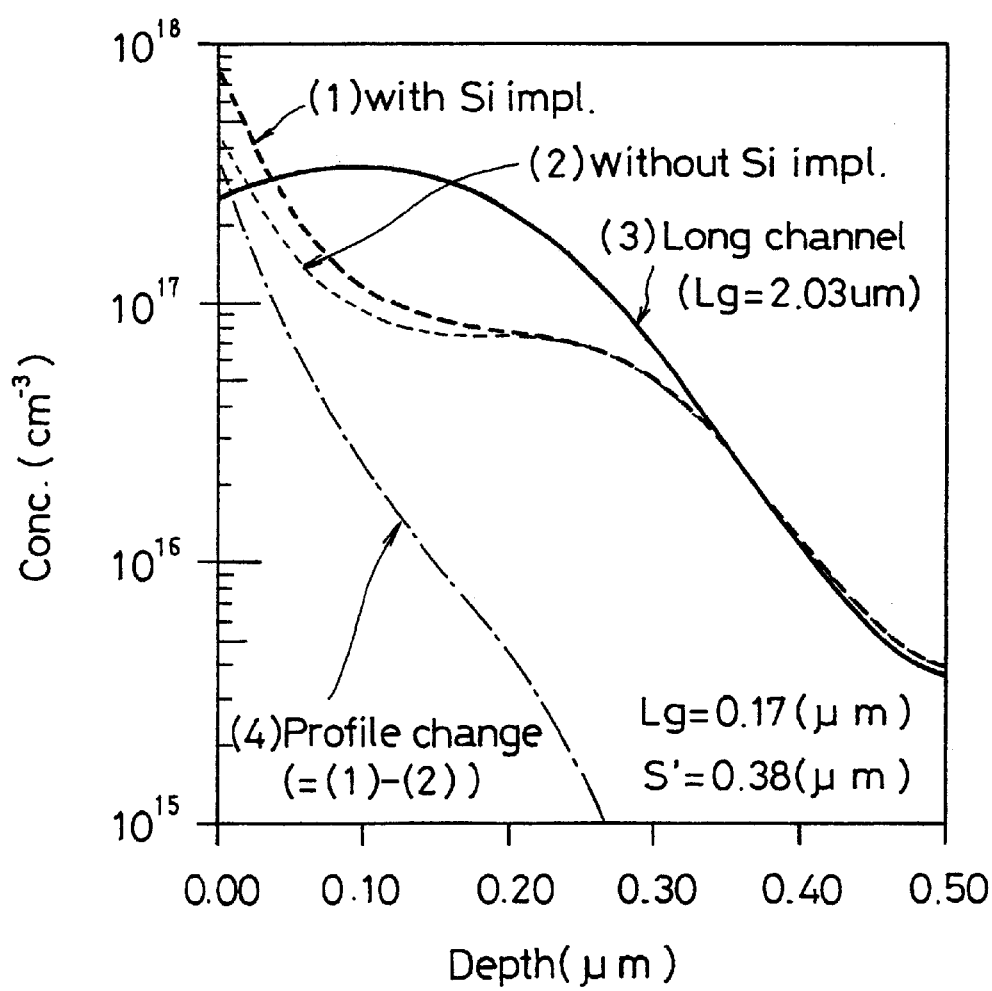
FIG. 11 presents data that explain the profile setting for the offset component in the setting method in FIG. 9.

It is to be noted that FIG. 11 presents the results of the measurement of the Vth-Vsub dependency. In FIG. 11, curve (1) represents the results of the measurement of the Vth-Vsub dependency of the MOSFET on which the additional ion implantation has been implemented, whereas curve (2) represents the results of the measurement of the Vth-Vsub dependency of the MOSFET on which the additional ion implantation has not been implemented. In addition, curve (3) represents the long channel profile of a long channel device with its gate length Lg at 2.03 micrometers, and curve (4) represents the quantity of change in the channel profile caused by the implantation damage.

It is generally assumed that non-uniform distribution of the impurity profile at the channel surface in a normal MOSFET is caused by damage due to the implantation implemented during the S/D formation. Thus, through the first method which utilizes the test data described above, a realistic one-dimensional profile of the offset component can be obtained.

(b) In the second method, the one-dimensional profile of the offset component is determined through one-dimensional process simulation (point defect simulation). Namely, in this method, the point defect model illustrated in FIG. 12 or a higher grade model reflecting more detailed physics is solved through numerical calculation to extract a surface profile so that the one-dimensional profile of the offset component can be determined. Through this second method in which the process dependency can be incorporated into the one-dimensional profile to be extracted, a distribution that reflects the physics can be achieved.

(c) In the third method, the one-dimensional impurity profile is determined by various functional expressions. Namely, in the third method, the one-dimensional profile of the offset component is functionally expressed through an exponential function, a delta function, a Gaussian distribution function or a spline function, as shown in FIG. 13, for instance, or through superimposing these functions to determine the parameters of the functions based upon the electrical characteristics. Through the third method, a situation in which the measured electrical characteristics and the simulated electrical characteristics do not match can be dealt with in a flexible manner by modifying the functional expressions.

(S/D Profile Extraction Stage 150)

In the S/D profile extraction stage 150, which corresponds to the second stage, an S/D profile is extracted. In the S/D profile extraction stage 150, the S/D profile is extracted based upon the Vsub dependency of the Vth-Lg characteristics with the two-dimensional channel profile pertaining to a short channel device which is obtained in the two-dimensional channel profile extraction stage 140 fixed.

Figure 5:
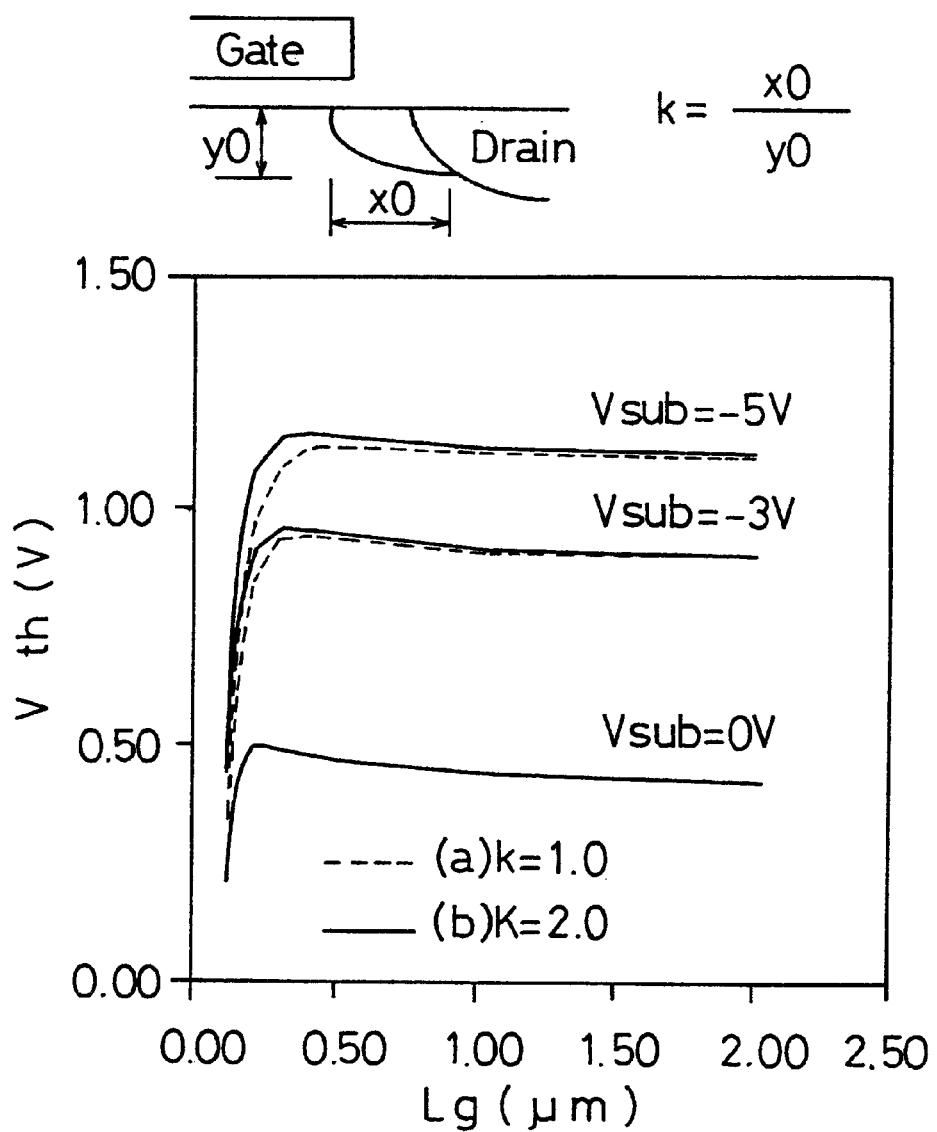
FIG. 5 presents measurement results that demonstrate the substrate bias voltage dependency of the threshold voltage-gate length characteristics.

Unlike in a long channel device, the channel profile, which is subject to the influence of the S/D profile is widely distributed in the direction of the channel length in a short channel device. As a result, in a short channel device, various electrical characteristics demonstrate a high degree of sensitivity to the S/D profile. Thus, the S/D profile can be extracted from the electrical characteristics pertaining to a short channel device. In addition, as illustrated in FIG. 5, the S/D profile manifests sensitivity to the Vth-Lg dependency only in the bias area where the substrate bias voltage Vsub is not 0. Thus, it is necessary to extract the Vsub dependency of the Vth-Lg characteristics when extracting the S/D profile from the Vth-Lg characteristics in the S/D profile extraction stage 150.

Figure 14:
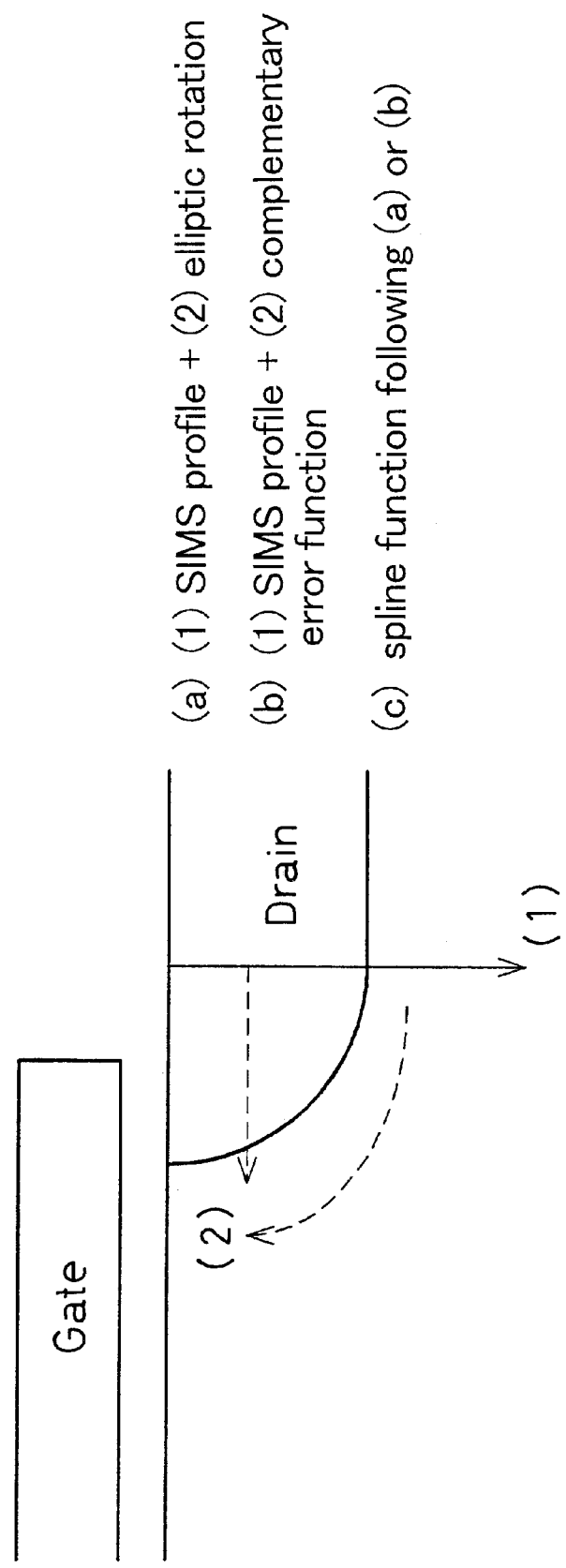
FIG. 14 illustrates the method for expressing the source/drain profile that may be adopted in the profile extraction method in FIG. 1.

In the S/D profile extraction stage 150 described above, a virtual S/D profile may be expressed by adopting the method illustrated in FIG. 14, for instance. In the method illustrated in FIG. 14, first, the S/D profile in the direction of the channel depth is determined through SIMS measurement. Next, the S/D profile is expressed as a two-dimensional function by, for instance, implementing processing along the direction of the channel length using an elliptic rotation function or a complementary error function or superimposing the two or the like, or by further implementing processing using a two-dimensional spline function after the processing described above.

In the method for expressing the S/D profile in this manner, since the results of the SIMS measurement are used in the distribution in the direction of the channel depth, only the parameters relevant to the extension in the direction of the channel length need to be optimized. As a result, the calculation of the S/D profile can be executed in a simple manner requiring only a short period of time. In addition, by superimposing functional expressions, subtle changes in the S/D profile shape in the direction of the channel length can be supported.

In the two-dimensional profile extraction stage 130, which corresponds to the third stage, the two-dimensional channel profile extraction stage 140 and the S/D profile extraction stage 150 explained above are repeated until the simulation value of the Vth-Lg characteristics that is calculated using the extracted two-dimensional channel profile and S/D profile matches the measured values of all the substrate bias voltages Vsub. Consequently, through the two-dimensional profile extraction stage 130, both the two-dimensional channel profile and the S/D profile are optimized and are extracted at the same time.

Figure 2:
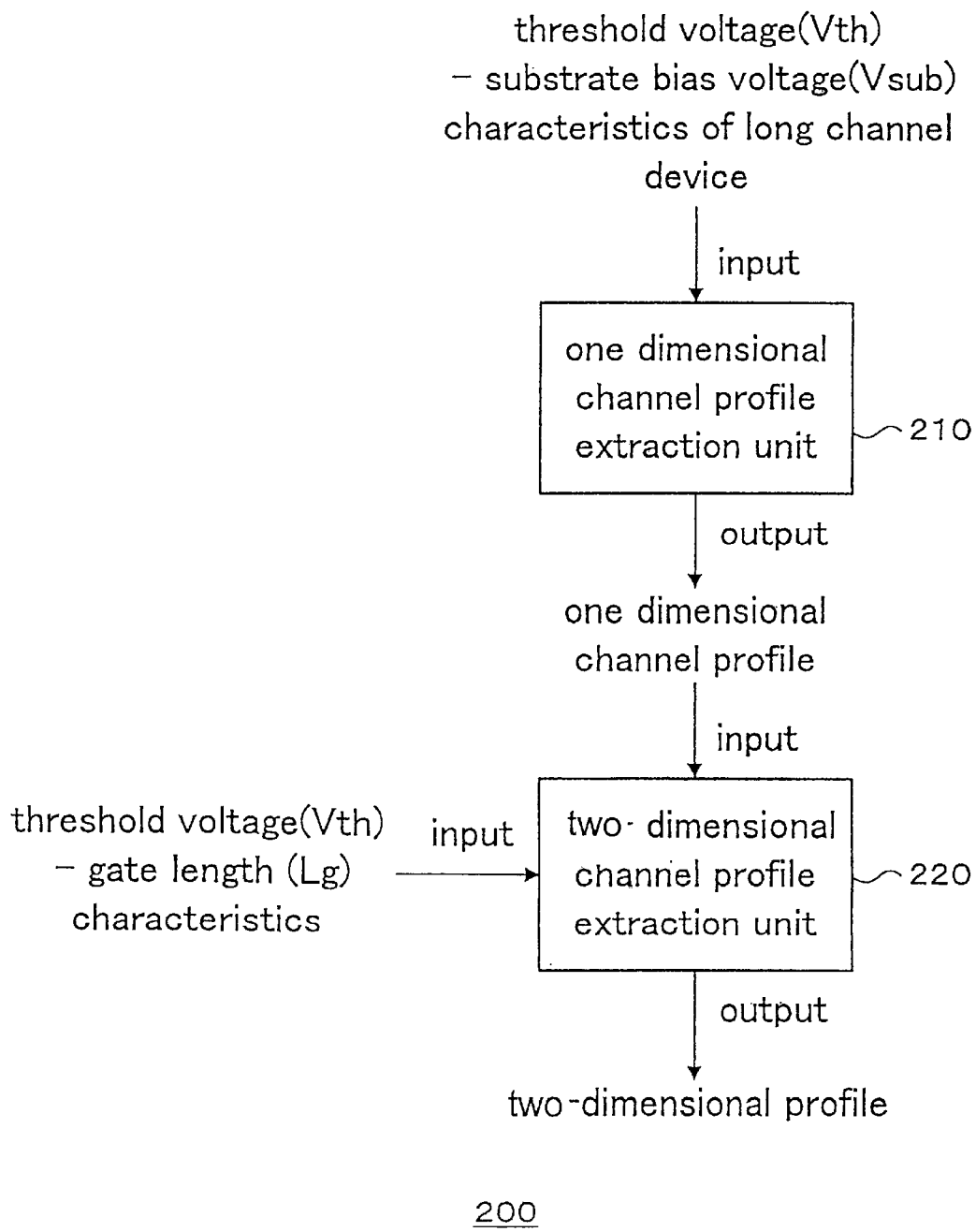
FIG. 2 is a schematic block diagram illustrating the structure of a profile extraction apparatus that may adopt the present invention.

FIG. 2 schematically illustrates the structure of a profile extraction apparatus 200 in an embodiment which may adopt the profile extraction method 100 explained earlier. The profile extraction apparatus 200 comprises a one-dimensional channel profile extraction unit 210 and a two-dimensional profile extraction unit 220. In the profile extraction apparatus 200, the one-dimensional channel profile extraction unit 210 is provided with one input portion and one output portion so that when the Vth-Vsub characteristics of a long channel device are input through its input portion, it executes the initial profile extraction stage 110 and the long channel profile extraction stage 120 illustrated in FIG. 1 to output a one-dimensional channel profile through its output portion.

In addition, the two-dimensional profile extraction unit 220, which is provided with two input portions and one output portion, implements the two-dimensional profile extraction stage 130 (which includes the two-dimensional channel profile extraction stage 140 and the S/D profile extraction stage 150 as explained earlier) when the one-dimensional channel profile is input through one of its input portions and the Vth-Lg characteristics of the MOSFET is input through the other input portion to output a two-dimensional profile through its output portion. The two-dimensional profile that is output from the two-dimensional profile extraction unit 220 in this process is constituted of the two-dimensional channel profile and the S/D profile.

In the profile extraction apparatus 200 structured as described above, the output portion of the one-dimensional channel profile extraction unit 210 is connected to the one input portion of the two-dimensional profile extraction unit 220.

In the embodiment described above, the profile is extracted using the electrical characteristics of two or more devices having different gate lengths Lg. Consequently, the two-dimensional profile of the MOSFET that is ultimately extracted assures the electrical characteristics of all the devices used in the profile extraction. In addition, since the embodiment can be implemented by using only the threshold voltage Vth as the target electrical characteristics, the number of targets is reduced in comparison to the methods in the prior art that utilize the CV characteristics and the IV characteristics to facilitate the optimization of parameters to be matched and to achieve high speed calculation.

Furthermore, the presence/absence of sensitivity of the S/D profile to the Vth-Lg characteristics may be utilized in this embodiment. Namely, in the embodiment, the optimization of the channel profile shape can be achieved in the area of the substrate bias voltage Vsub, which is not dependent upon the S/D profile shape and the optimization of the S/D profile shape is achieved independently of the channel profile in the remaining area of the substrate bias voltage Vsub. Consequently, through this embodiment, which makes it possible to determine the two-dimensional channel profile shape and the S/D profile shape with ease, the channel profile and the S/D profile can be extracted at the same time at the stage in which all the electrical characteristics are matched.

Second Embodiment

Figure 15:
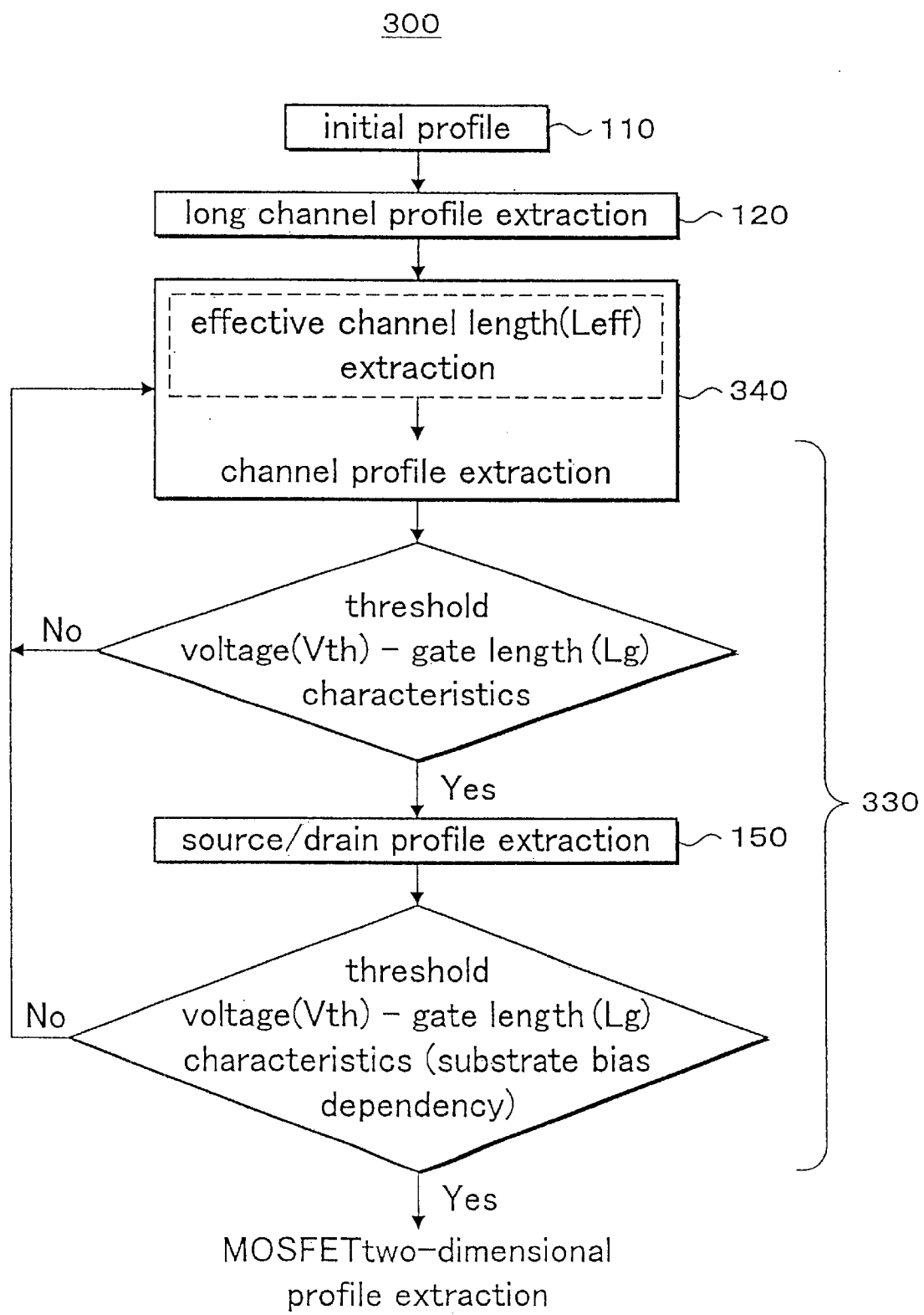
FIG. 15 presents a flowchart provided for purposes of explaining another profile extraction method that may adopt the present invention.

Next, in reference to FIGS. 15 to 20, the second embodiment is explained. FIG. 15 is a flowchart provided to explain the profile extraction method 300 in this embodiment. As shown in FIG. 15, in the profile extraction method 300 in the embodiment, a two-dimensional profile extraction stage 330 is implemented instead of the two-dimensional profile extraction stage 130 implemented in the profile extraction method 100 in the first embodiment illustrated in FIG. 1. The two-dimensional profile extraction stage 330 is constituted by replacing the two-dimensional channel profile extraction stage 140 in the two-dimensional profile extraction stage 130 with a two-dimensional channel profile extraction stage 340.

Figure 16:
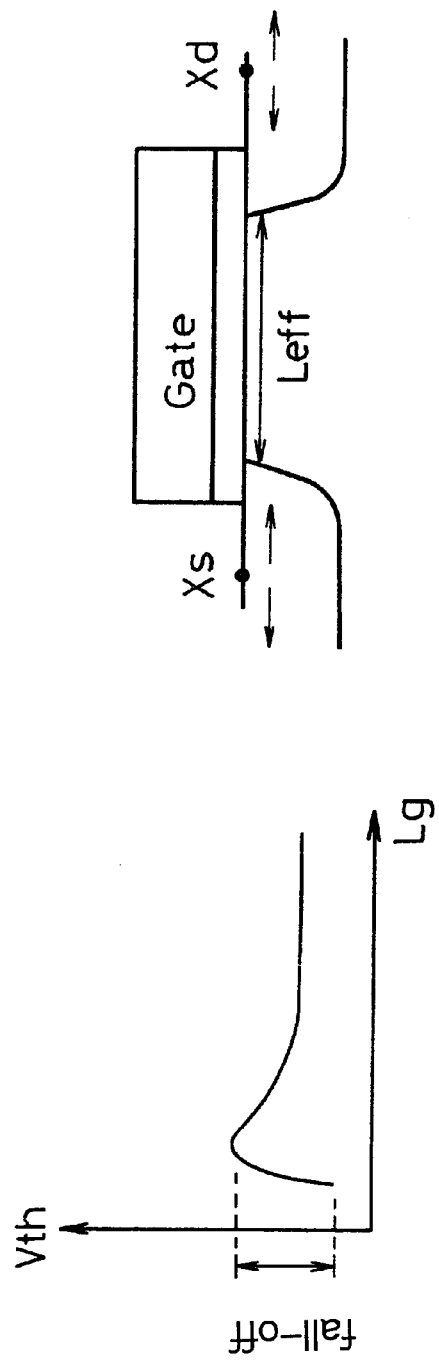
FIG. 16 illustrates a method for extracting the effective channel length that may be adopted in the profile extraction method in FIG. 15.

The two-dimensional channel profile extraction stage 340 is constituted by including effective channel length Leff extraction that is performed prior to the two-dimensional channel profile extraction stage 140. In the two-dimensional channel profile extraction stage 340, the coordinates of the S/D profile are shifted in a direction extending parallel to the channel so as to match the drain bias voltage Vd dependency of the target (measured) threshold voltage Vth to determine the effective channel length Leff. In other words, in the two-dimensional channel profile extraction stage 340, the source end position Xs and the gate end position Xd on the simulation are moved in the direction of the channel length so that the value achieved by partially differentiating the threshold voltage Vth once using the drain bias voltage Vd matches the target (measured value) to extract the effective channel length Leff, as illustrated in FIG. 16.

As explained above, in this embodiment, by adding the adjustment of the Leff as a pre-treatment, fall off in the Vth-Lg characteristics (the drop in the threshold voltage Vth in the short channel area) can be adjusted to the target (measured value) with greater ease. In addition, the method for obtaining the effective channel length Leff from the drain bias Vd dependency of the threshold voltage Vth is correct from a physical point of view as well. Since the effective channel length greatly influences the threshold voltage Vth, accurate extraction of the effective channel length Leff as achieved in this embodiment is crucial for preventing divergence that may result in incorrect profile extraction.

Figure 17:
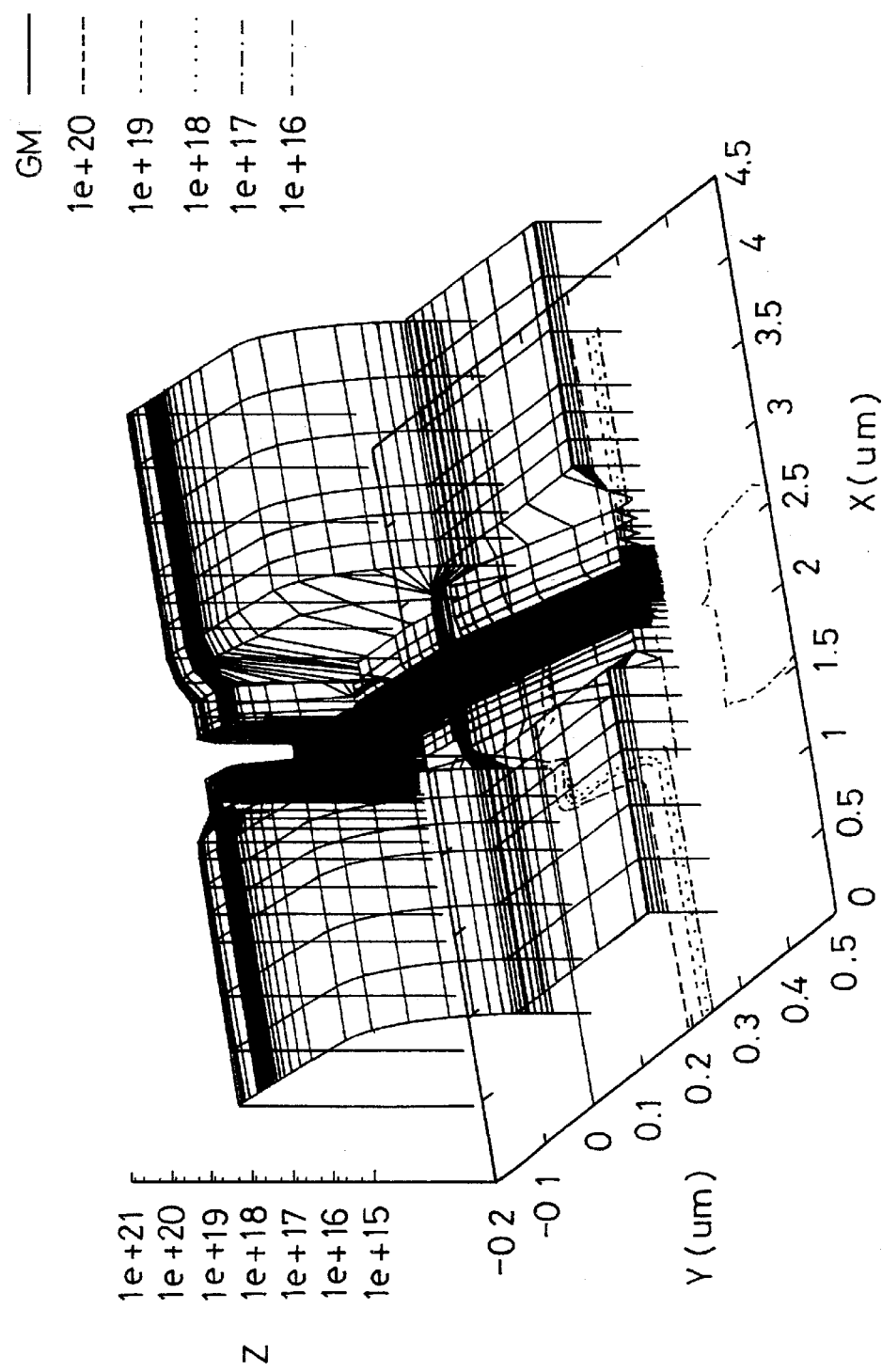
FIG. 17 presents test results regarding the two-dimensional profile pertaining to the profile extraction method in FIG. 15.

Now, in reference to FIGS. 17 to 20, the results of tests conducted by the inventor of the present invention by adopting this embodiment are presented. First, FIG. 17 presents a two-dimensional profile extracted in the testing. In FIG. 17, the position in the direction of the channel length is indicated on the X axis, the position in the direction of the channel depth is indicated on the Y axis and the impurity concentration is expressed on the Z axis. In addition, FIG. 18 presents the one-dimensional channel profile of a MOSFET having a gate length Lg of 0.12 micrometers and the one-dimensional channel profile of a MOSFET having a gate length Lg of 2.03 micrometers.

Figure 19:
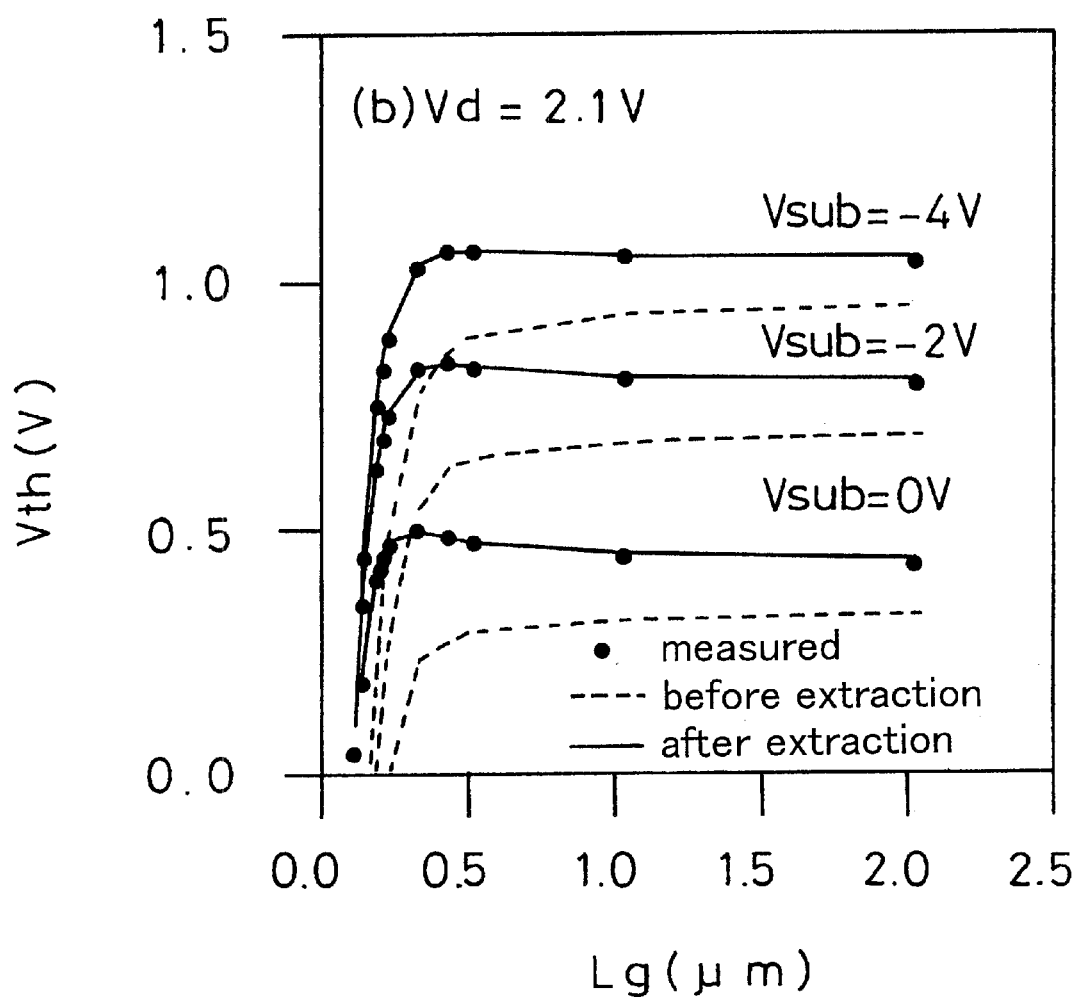
FIG. 19 presents test results regarding the electrical characteristics pertaining to the profile extraction method in FIG. 15.
Figure 20:
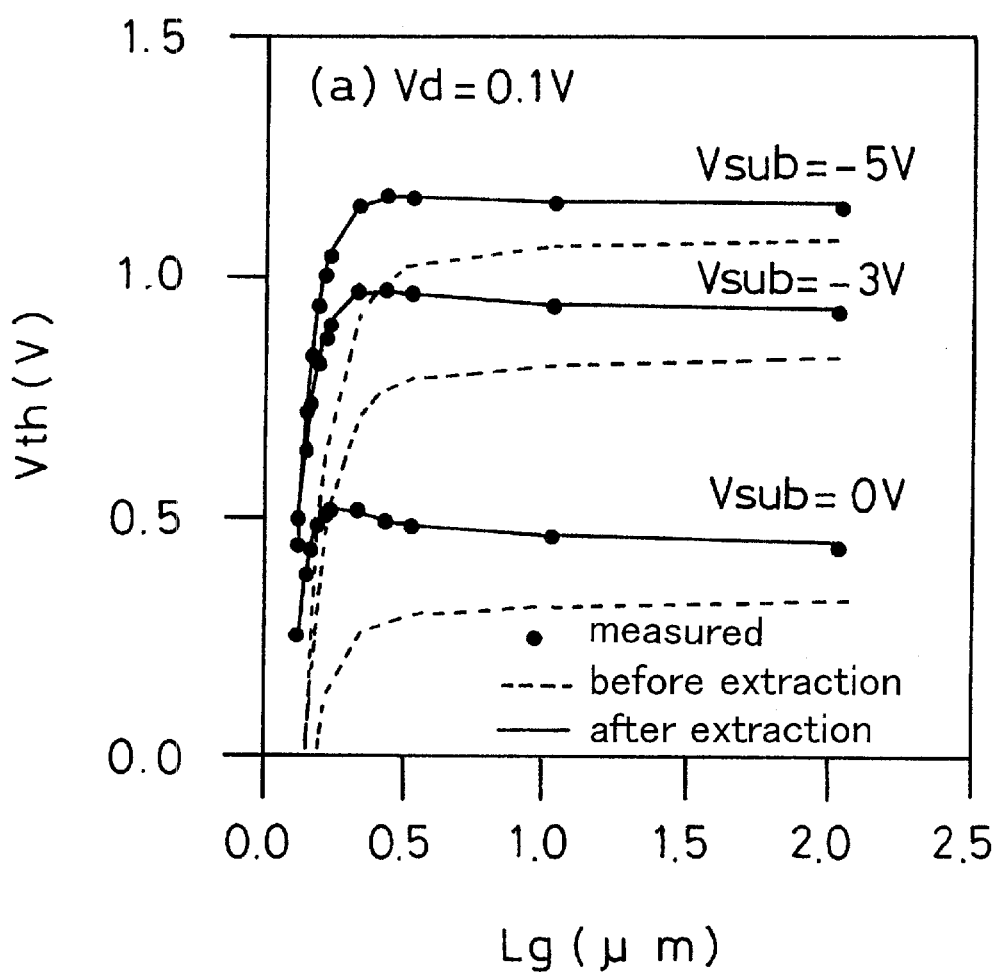
FIG. 20 presents test results regarding the electrical characteristics pertaining to the profile extraction method in FIG. 15.

FIGS. 19 and 20 present the results of tests on the Vth-Lg dependency observed when Vsub is 0, −2 and −4. It is to be noted that FIG. 19 presents the test results achieved under a condition in which the drain bias voltage Vd is at 2.1V, whereas FIG. 20 presents the test results achieved under a condition in which the drain bias voltage Vd is at 0.1V. In FIGS. 19 and 20, the measured values are indicated with the filled circles, the calculated values obtained from the two-dimensional profile extracted through the testing are indicated with solid lines and the calculated values obtained from the pre-extraction profile are indicated with broken lines. As FIGS. 19 and 20 demonstrate, the tests prove that by adopting this embodiment, extremely accurate Vth-Lg characteristics are reproduced.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

For instance, while the profile extraction method for extracting a profile from the characteristics of the threshold voltage is explained in reference to the embodiments, the present invention is not restricted to such a structure. The present invention may be adopted in a profile extraction method and a profile extraction apparatus that extract a profile from various other electrical characteristics, e.g., the characteristics of the drain bias voltage, the characteristics of the channel current and the like.

In addition, the profile extraction method that utilizes an exponential function, a spline function or the like for functional expression of a profile is explained as an example in reference to the embodiments, the present invention is not limited to such a structure. It goes without saying that the present invention may be adopted in a profile extraction method and a profile extraction apparatus that utilize various other functions for functional expression of a profile.

According to the present invention, a profile is extracted from the electrical characteristics of an actual device. Consequently, unlike cases in which the profile is extracted from the electrical characteristics of a sample device or a TEG pattern, the profile of the actual device itself can be assured. In addition, the S/D profile can be extracted together with the channel profile according to the present invention. Thus, according to the present invention, by extracting the S/D profile, which has tended to be of less significance in the prior art, the accuracy with which the channel profile is extracted can be further improved.

Furthermore, according to the present invention, the channel profile is extracted by taking into consideration of the gate length. Consequently, the profile can be assured for a device having a different gate length from the device that is actually fitted. Thus, profile extraction of an industrial device group can be achieved with relative ease and within a short length of time.

By adopting the present invention, it becomes possible to arithmetically calculate various electrical characteristics of an actual device accurately and efficiently.

The entire disclosure of Japanese Patent Application No.10-285699 filed on Oct. 7, 1998 including specification, claims, drawings and summary is incorporated herein by reference in its entirety.

What is claimed is:

1. A profile extraction method for extracting a profile of a semiconductor device, comprising:
   a first stage for extracting a two-dimensional channel profile that demonstrates dependency on gate length, based upon electrical characteristics and a virtual channel profile, whereby substrate bias voltage dependency of threshold voltage and gate length characteristics are used as said electrical characteristics;
   a second stage for extracting a source/drain profile based upon dependency of said electrical characteristics on an application voltage and said two-dimensional channel profile; and
   a third stage in which said first stage and said second stage are repeated until an error between simulation values of the threshold voltage and gate length characteristics extracted in said first and second stages, with respect to measured values of threshold voltage and gate length characteristics at an application voltage, falls within an allowable error range,
   said two-dimensional channel profile being expressed through a model formula: C (x, y)=delta C pile-up (x, y)+delta CBD (x, y)+C bulk (y), wherein delta C pile-up represents a pile-up (accumulated) component of an impurity change quantity, delta CBD represents an accelerated diffusion component of said impurity change quantity and C bulk (y) indicates a long channel profile.

2. A profile extraction method according to claim 1, wherein said first stage includes extracting an effective channel length.

3. A profile extraction method according to claim 1, wherein said substrate bias voltage is 0.

4. A profile extraction method according to claim 1, wherein the application voltage is a substrate bias voltage.

5. A profile extraction method according to claim 1, wherein said source/drain profile is expressed through a profile extracted through secondary ion mass spectrometry in a direction of channel depth.

6. A profile extraction method according to claim 5, wherein said source/drain profile is extended along the direction of channel depth by implementing elliptic rotation processing on said source/drain profile.

7. A profile extraction method according to claim 6, wherein said source/drain profile is expressed through further processing that utilizes a spline function implemented after said elliptic rotation processing.

8. A profile extraction method according to claim 1, wherein
   said virtual channel profile is a two-dimensional profile achieved by superimposing a profile of a non-uniform component on a uniform profile uniformly distributed in a direction of channel length, and
   a one-dimensional profile of said non-uniform component in a direction of channel depth is set based upon results of comparison of said electrical characteristics of a semiconductor device on which ion implantation has been implemented and a semiconductor device on which ion implantation has not been implemented.

9. A profile extraction method according to claim 8, wherein the one-dimensional profile of said non-uniform component in the direction of channel depth is set during a manufacturing process of the semiconductor device.

10. A profile extraction method according to claim 7, wherein the one-dimensional profile of said non-uniform component in the direction of channel depth is expressed With one or more functions from a group comprising an exponential function, a delta function, a Gaussian function and a spline function.

11. A profile extraction method of claim 7, further comprising:
   determining and outputting the one-dimensional channel profile using a one-dimensional channel profile extraction unit, responsive to the electrical characteristics; and
   determining and outputting the two-dimensional profile using a two-dimensional channel profile extracting unit, responsive to the electrical characteristics.

12. A profile extraction method according to claim 8, wherein said uniform profile is achieved by uniformly distributing a long channel profile in the direction of channel length.

13. A profile extraction method according to claim 12, wherein said long channel profile is extracted from an initial profile and the dependency of threshold voltage on substrate bias voltage.

14. A profile extraction method according to claim 13, wherein said initial profile is extracted through a process simulation.

15. A profile extraction method according to claim 13, wherein said initial profile is extracted from results of a SIMS measurement on a sample device.

16. A profile extraction method according to claim 13, wherein said initial profile is extracted through a simulation performed by using C-V characteristics of a sample device or a TEG pattern.

17. A profile extraction method according to claim 13, wherein said initial profile is extracted through a simulation performed by using I-V characteristics of a sample device or a TEG pattern.

18. A profile extraction method for extracting a profile of a semiconductor device, comprising:
   a first stage for extracting a two-dimensional channel profile that demonstrates dependency on gate length, based upon electrical characteristics and a virtual channel profile, whereby substrate bias voltage dependency of threshold voltage and gate length characteristics are used as said electrical characteristics;
   a second stage for extracting a source/drain profile based upon dependency of said electrical characteristics on an application voltage and said two-dimensional channel profile; and
   a third stage in which said first stage and said second stage are repeated until an error between simulation values of the threshold voltage and gate length characteristics extracted in said first and second stages, with respect to measured values of threshold voltage and gate length characteristics at an application voltage, falls within an allowable error range,
   said two-dimensional channel profile being expressed through a model formula having an impurity concentration C (x, y) expressed as C (x, y)=A*delta C pile-up (y)*exp (−x/lambda 1)+B*delta CBD (y)*exp (−x/lambda 2)+C bulk (y), wherein A and B represent fitting parameters that are determinable independently of each other, x represents a coordinate in the direction of channel length, y represents a coordinate in a direction of channel depth, delta C pile-up represents a pile-up (accumulated) component of an impurity change quantity, delta CBD represents an accelerated diffusion component of said impurity change quantity, C bulk (y) represents a long channel profile, lambda 1 represents an attenuation length of said pile-up component of said impurity change quantity in said direction of channel length and lambda 2 represents an attenuation length of said accelerated diffusion component of said impurity change quantity in said direction of channel length.

19. A profile extraction method according to claim 18, wherein in said model formula, delta C pile-up (y)=A'*exp (−y/lambda 3), wherein A' represents a fitting parameter and lambda 3 represents an attenuation factor of said pile-up component of said impurity change quantity in said direction of channel depth, and delta CBD (y)=B'*C bulk$^{(short)}$ (y)*C bulk (y), wherein B' represents a fitting parameter that is determinable independently of A', and C bulk$^{(short)}$ (y) represents a one-dimensional channel profile at a channel central area of a short channel device.

* * * * *